Figure 1:
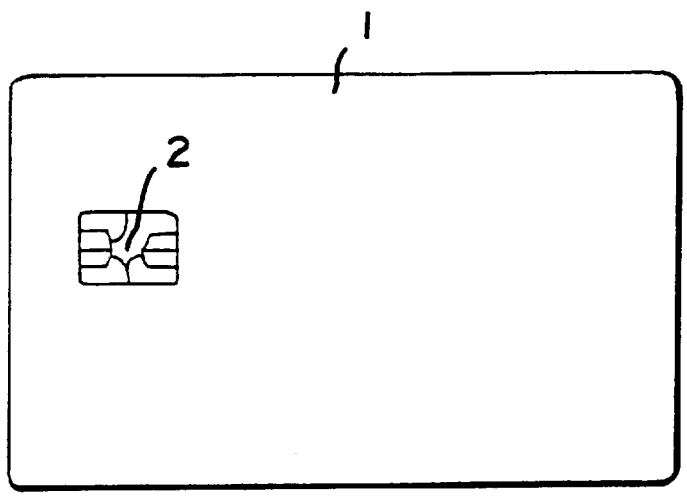

United States Patent
Haghiri-Tehrani

[19]

[11] Patent Number: 5,965,867
[45] Date of Patent: Oct. 12, 1999

[54] DATA MEDIUM INCORPORATING INTEGRATED CIRCUITS

[75] Inventor: Yahya Haghiri-Tehrani, Munich, Germany

[73] Assignee: Gieseke & Devrient GmbH, Munich, Germany

[21] Appl. No.: 08/983,132

[22] PCT Filed: Jul. 19, 1996

[86] PCT No.: PCT/EP96/03195

§ 371 Date: Apr. 30, 1998

§ 102(e) Date: Apr. 30, 1998

[87] PCT Pub. No.: WO97/04416

PCT Pub. Date: Feb. 6, 1997

[51] Int. Cl.⁶ .................................................. G06N 19/06
[52] U.S. Cl. ........................................... 235/492; 235/441
[58] Field of Search .................................. 235/492, 441, 235/486, 487, 382, 375

[56] References Cited

U.S. PATENT DOCUMENTS

| 4,683,372 | 7/1987 | Matsumoto | 235/492 |
|---|---|---|---|
| 4,736,094 | 4/1988 | Yoshida | 235/379 |
| 4,764,666 | 8/1988 | Bergeron | 235/380 |
| 4,797,542 | 1/1989 | Hara | 235/380 |

FOREIGN PATENT DOCUMENTS

| 0 072 759 | 2/1983 | European Pat. Off. . |
|---|---|---|
| 0 417 887 | 3/1991 | European Pat. Off. . |
| 0 488 364 | 6/1992 | European Pat. Off. . |
| 0 587 011 | 3/1994 | European Pat. Off. . |
| 42 41 482 | 6/1994 | Germany . |
| 94/29950 | 12/1994 | WIPO . |
| 96/16378 | 5/1996 | WIPO . |

*Primary Examiner*—Thien Le
*Attorney, Agent, or Firm*—Bacon & Thomas, PLLC

[57] ABSTRACT

A data carrier is shown having at least two integrated circuits disposed one on the other in the carrier in a partial area, at least one of the circuits being able to communicate with external devices via coupling elements. To make communication between the integrated circuits as simple as possible, the integrated circuits have communication units permitting communication between the circuits via a nongalvanic, contactless coupling.

23 Claims, 5 Drawing Sheets

DATA MEDIUM INCORPORATING INTEGRATED CIRCUITS

This invention relates to a data carrier having at least two integrated circuits disposed one on the other in a partial area of the data carrier, at least one of the circuits being able to communicate with external devices via coupling elements.

Data carriers having built-in integrated circuits have been known for some time and are used for example in the form of chip cards e.g. as access entitlement for in-house access control systems or as means of payment in public telephone booths. Usually such a chip card consists of a card body and an electronic module including coupling elements and an integrated circuit connected electrically with the coupling elements and able to communicate with external devices via the coupling elements. The coupling elements are usually designed as contact surfaces for galvanically contacting communication or as a coil for noncontacting communication.

Due to increasingly complex chip card applications the integrated circuits are also becoming larger, which increases the risk of breakage for the integrated circuits in the data carrier.

There have thus been various proposals for instance to distribute the functions of a large integrated circuit over a plurality of small integrated circuits. The integrated circuits are usually disposed on the electronic module either side by side or one on the other.

DE-OS 29 42 397 shows for example such an electronic module which can be disposed in the gap of a data carrier. The module has a supporting substrate with two integrated circuits disposed on one side thereof and a third integrated circuit disposed on the other side thereof. On the side of the third integrated circuit the substrate has contact surfaces with conductive paths connected thereto whose ends are connected electrically with the terminals of the integrated circuits. To permit the integrated circuits to be connected starting at the contact surfaces via the conductive path, the substrate is plated-through in several places.

In the electronic module known from DE-OS 29 42 397 the risk of breakage of the individual integrated circuits is reduced, but a supporting substrate with a relatively large surface must be used since two integrated circuits are disposed side by side. Moreover, each integrated circuit must be connected with the ends of said conductive paths during production of the electronic module, which requires high production effort. The production of the stated through-plating also requires high production effort. In addition, the incorporation of the module in the data carrier is impeded since integrated circuits are disposed on both aides of the supporting substrate.

The invention is therefore based on the problem of providing a data carrier which is easy and thus cost-effective to produce.

This problem is solved according to the characterizing part of claim 1.

The basic idea of the invention is that the two integrated circuits communicate with each other via a nongalvanic, contactless coupling.

This results in several advantages. One of the two integrated circuits need no longer be connected electrically with the conductive paths on the supporting substrate, which leads to a reduction of production effort. Further, the integrated circuits can be disposed one on the other spatially separated without any plated-through holes having to be provided for electric connections for communication between the two integrated circuits. Further, it is much more difficult to monitor communication between the integrated circuits since the integrated circuits communicate with each other contactlessly.

According to a first embodiment of an inventive data carrier, the two integrated circuits are disposed one on the other directly adjacent each other. The two integrated circuits can preferably be interconnected via an adhesive layer. The means for communication between the integrated circuits are preferably disposed an opposing surfaces of the integrated circuits. Such means can be for example coils, capacitive elements or optocouplers. The means can either be located outside the integrated circuits or be integrated monolithically in the integrated circuits.

In a second embodiment, the two integrated circuits are disposed spatially separated in the data carrier. One way of doing this is to dispose a first circuit in a gap of the data carrier. The first circuit is disposed for example on an electronic module known in the art, but can also be disposed in the gap without an electronic module, in which came the coupling elements for communication with external devices are integrated monolithically in the integrated circuit. The second integrated circuit can be disposed on the side of the data carrier opposite the first integrated circuit in a second gap of the data carrier. The means for communication between the integrated circuits are either coils or capacitive elements which are either located outside the integrated circuits or monolithically integrated.

Alternatively, one of the integrated circuits or both circuits can also each be an integral part of a self-adhesive label, which is stuck either to the side of the data carrier opposite the other integrated circuit or to the same side, so that no gap is necessary for the particular circuit in the data carrier.

Figure 2:
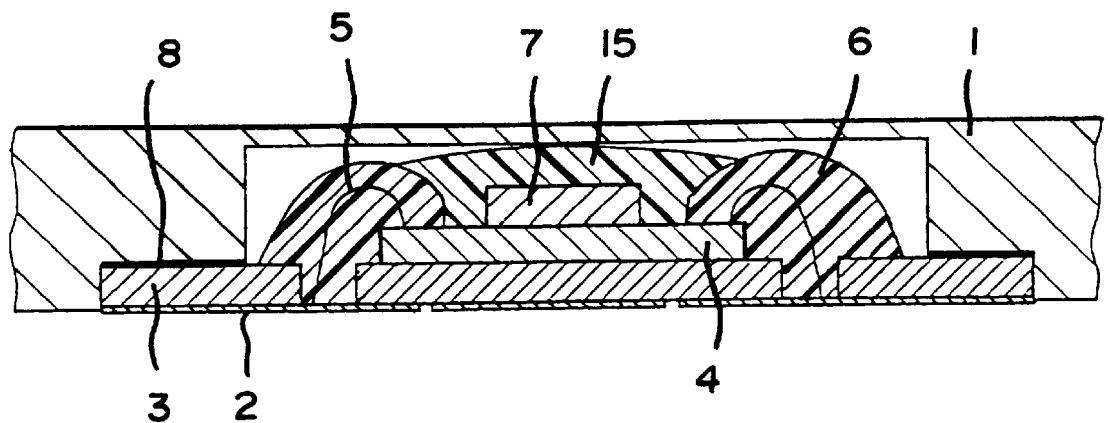
Figure 3:
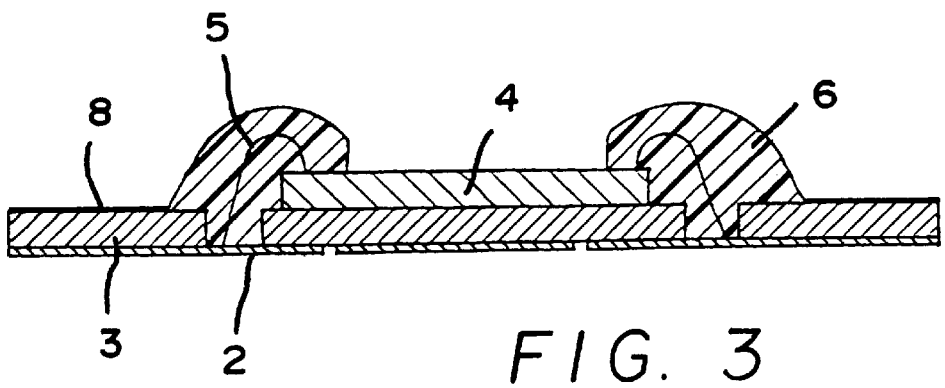
Figure 4:
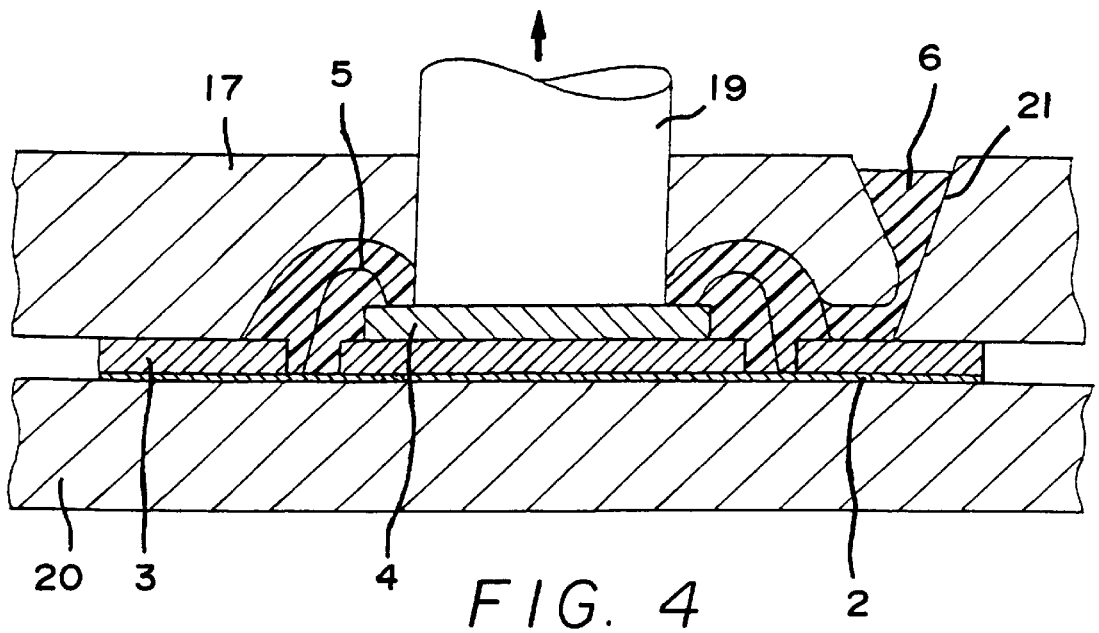
Figure 5:
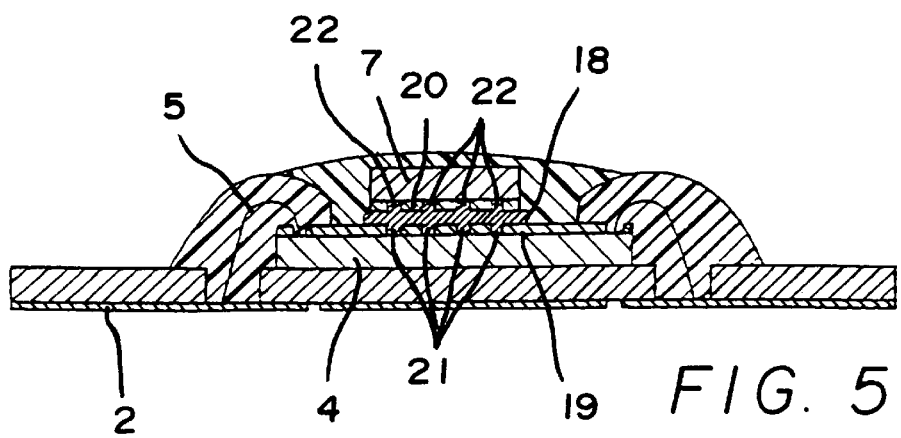
Figure 6:
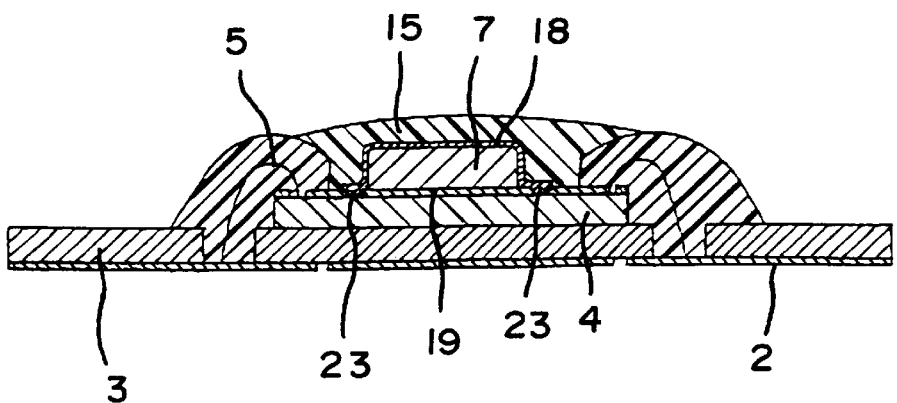
Figure 7:
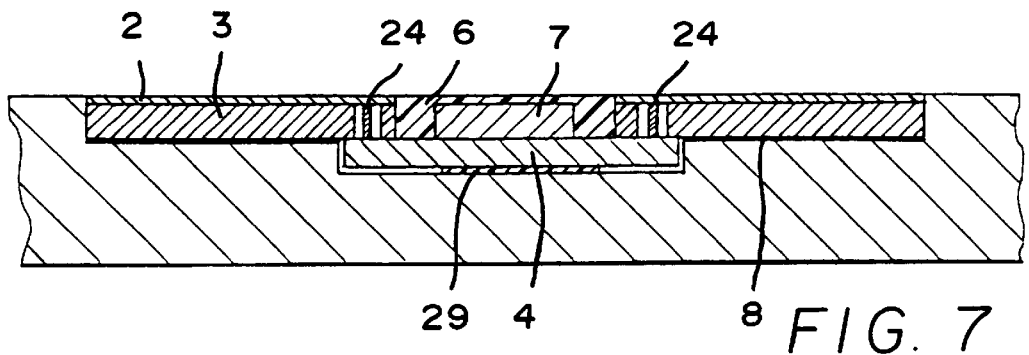
Figure 8:
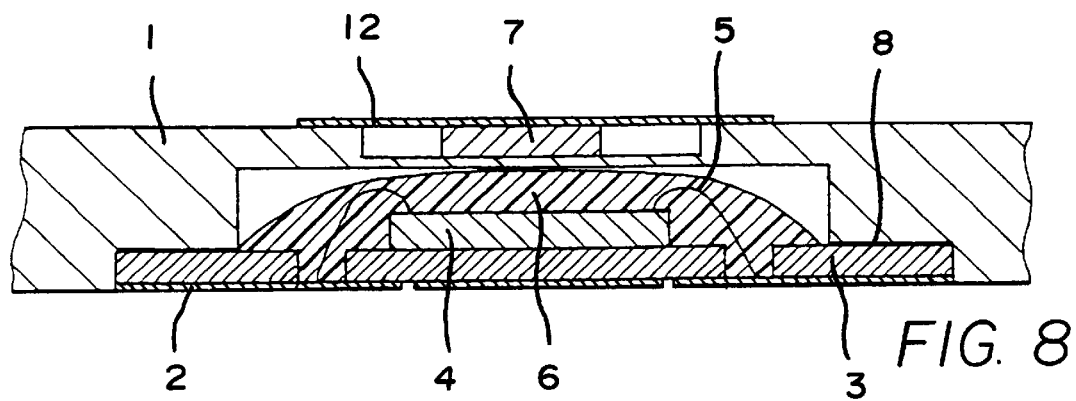
Figure 9:
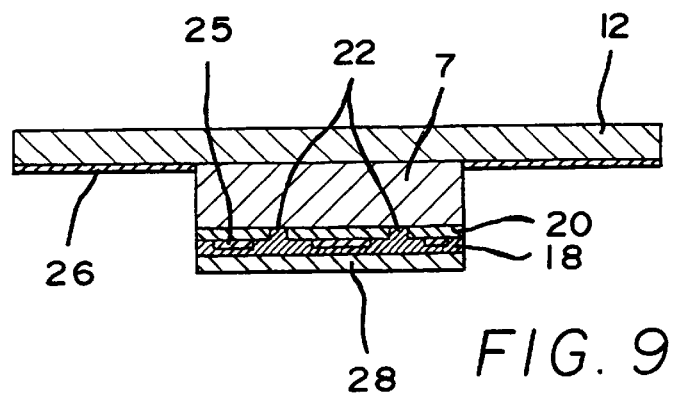

Further advantages and developments of the invention are shown in the following figures, in which:

FIG. 1 shows an inventive data carrier,

FIG. 2 shows the data carrier of FIG. 1 in cross section with directly adjacent integrated circuits, FIG. 3 shows a section of an unfinished electronic module for producing the data carrier of FIGS. 1 and 2, FIG. 4 shows a section of a casting mold for producing the electronic module of FIG. 3, FIGS. 5 and 6 show sections of the electronic module of FIG. 3 with an additional electronic protective case, FIG. 7 shows a section of a second embodiment of a data carrier with directly adjacent integrated circuits, FIG. 8 shows an inventive data carrier with spatially separated integrated circuits, FIG. 9 shows integrated circuit 7 of FIG. 8 with an additional electronic protective case, FIGS. 10 to 13 show unfinished electronic modules for producing the data carrier of FIGS. 1 to 6 and FIG. 8.

FIG. 1 shows an inventive data carrier. The data carrier includes card body 1 and coupling elements in the form of contact surfaces 2 via which at least one of the integrated circuits located in the interior of the data carrier can communicate with external devices.

FIG. 2 shows the section of a first embodiment of an inventive data carrier wherein two integrated circuits 4 and 7 are disposed one an the other directly adjacent. The integrated circuits are interconnected via an adhesive layer not shown here and can communicate with each other via a nongalvanic, contactless coupling. The coupling between the integrated circuits is disposed on the opposing surfaces of the integrated circuits. Said coupling involves coils or capacitive elements or optocouplers.

Integrated circuits 4 and 7 are disposed on supporting substrate 3 of an electronic module. On the side of substrate 3 opposite integrated circuits 4 and 7 there are coupling elements for communication with external devices in the form of metallic contact surfaces 2 which are connected with terminals of integrated circuit 4 via electric connections, here bonding wires 5.

Integrated circuit 4 can thus communicate with external devices via the coupling elements, here contact surfaces 2. The nongalvanic contactless coupling of integrated circuits 7 and 4 can be designed such that external devices can only access second integrated circuit 7 via first integrated circuit 4. Further, the functions of circuits 4 and 7 can be coordinated with each other such that the data carrier performs certain security functions only if at least one of circuits 4 and 7 is coupled in genuinely.

Integrated circuits 4 and 7 and bonding wires 5 are cast or encapsulated by casting compound 6 and 15 for protection against mechanical loads. The electronic module is glued to card body 1 via adhesive layer 8.

The electronic module need of course not be cast by two casting compounds; both integrated circuits can also be covered by one casting compound.

FIG. 3 shows in cross section on unfinished electronic module for incorporation in the data carrier of FIGS. 1 and 2. In said module, partial areas of the integrated circuit here the edges of integrated circuit 4 and bonding wires 5 are cast while a central part on the surface of integrated circuit 4 is free from casting compound. This module involves the special advantage that integrated circuit 7 can easily be disposed on the module subsequently, since bonding wires 5 are well protected from mechanical loads so that the module can be stored or transported well.

Said electronic module of FIG. 3 is finished by disposing second integrated circuit 7 on first integrated circuit 4 for example with an adhesive and filling the remaining cavity around integrated circuit 7 with casting compound 15.

Casting 6 is produced via a mold as shown in cross section in FIG. 4. The mold consists substantially of two halves 17 and 20, half 20 being completely flat and half 17 having a mold cavity. In the center or the cavity in half 17 there is additionally movable die 19 that prevents the central inner part of the cavity from being filled with casting compound during casting of the module. The mold halves and die are preferably made of steel but can also be made of another material. The module is cast in the following steps. Mold halves 17 and 20 are mounted on the electronic module, movable die 19 retreating into half 17 after the latter is mounted on integrated circuit 4 in order to prevent destruction of integrated circuit 4. In a next step, liquid casting compound 6 is injected into mold half 17 via gate 21, thereby filling the cavity remaining between mold half 17 and the electronic module with casting compound 6. After casting compound 6 hardens, mold halves 17 and 20 are removed again. Any residues of casting compound in the area of very narrow gate 21 can be removed simply by being broken off.

If one of integrated circuits 4 and 7 or both circuits contain security functions and the integrated circuits must therefore be protected against improper separation, one can provide suitable means which render one or both integrated circuits useless upon improper separation of the integrated circuits so that they can no longer be employed. One can use for example a piezoelectric material whose ends are connected electrically with a protective circuit in one of the integrated circuits or in both circuits. Improper separation of the integrated circuits causes deformation of the piezoelectric material, thereby producing a voltage which can cause in the integrated circuit or circuits for example an erasure of data in the memory of the particular integrated circuit.

An electronic module according to FIG. 2 with such an electronic protective case is to be seen in FIG. 5. Electronic protective case 18 is provided between integrated circuits 4 and 7 in the form of a piezoelectric material. At places 21 and 22 electronic protective case 18 penetrates insulating layers 19 and 20 of integrated circuits 4 and 7 produced in the semiconductor production process, being connected electrically at said places with protective circuits in the integrated circuits. Removal of integrated circuit 7 thus causes an electric voltage between terminals 21 and also between terminals 22, which leads in integrated circuits 4 and 7 to erasure of the memories contained therein.

FIG. 6 shows another embodiment of the electronic module of FIG. 2 with an electronic protective case. The electronic protective case is only connected electrically with a protective circuit through perforations in insulating layer 19 in integrated circuit 4 so that only integrated circuit 4 is deactivated upon separation of integrated circuits 4 and 7.

Another embodiment of an electronic module in cross section wherein two integrated circuits are disposed one on the other directly adjacent is shown in FIG. 7. The electronic module shown here differs only slightly from the electronic modules shown above. It likewise includes contact surfaces 2 electrically connected with integrated circuit 4 through perforations in supporting substrate 3. The contacting between contact surfaces 2 and integrated circuit 4 is done by the flip-chip technique, which is well known from the prior art and will not be dealt with more closely here. Integrated circuit 7 is disposed on the side of integrated circuit 4 facing the substrate in a perforation of the substrate. The remaining cavity is filled with casting compound 6. To buffer uncast integrated circuit 4, elastic mass 29 such as silicone is additionally disposed in the gap of data carrier 1.

The electronic module shown by FIG. 7 has a few advantages over the modules shown above. The total height of the module its much smaller than that of the above modules since second integrated circuit 7 is disposed in the gap of substrate 3. Therefore, the total height of the substrate is reduced by the height of second integrated circuit 7. Moreover, the second integrated circuit is very easy to cast since no casting frame is required. Casting is confined merely to filling the remaining cavity in the area of integrated circuit 7 with casting compound 6.

In a third especially simple embodiment of an electronic module with two directly adjacent integrated circuits disposed one on the other, which is not shown here, the electronic module consists exclusively of two integrated circuits, both the coupling elements for communication with external devices and the coupling elements for nongalvanic, contactless coupling with the other integrated circuit being integrated monolithically in the circuits. The two integrated circuits must thus merely be glued together and disposed in a cavity of card body 1.

FIG. 8 shows in cross section a fundamental second embodiment of an inventive data carrier wherein integrated circuits 4 and 7 are disposed spatially separated in the data carrier. Electronic module 17 is disposed in a first gap of the card body. The electronic module is constructed substantially the same way as the electronic module of FIG. 2 described above, differing only in that integrated circuit 7 is not disposed on the electronic module. Second integrated circuit 7 is disposed on the side of the data carrier opposite first integrated circuit 4 in a second gap. This second gap is covered by self-adhesive label 12 in the shown example, but can also be filled by an opaque casting compound instead.

If security-relevant data are present in integrated circuit 7, integrated circuit 7 can also be provided with electronic protective case 18, as FIG. 9 shows. As in FIG. 5, the electronic protective case is connected electrically with integrated circuit 7 through perforations in insulating layer 20. Additionally there are silicone paths 25 between electronic protective case 18 and insulating layer 20 which act as separating means between insulating layer 20 and electronic protective case 18 for the reasons stated below, so that electronic protective case 18 and insulating layer 20 stick together only slightly. Further, integrated circuit 7 is glued firmly to self-adhesive label 12 so that integrated circuit 7 and label 12 provide a firm unit in the form of security label 27. The security label is glued via adhesives 26, 28 (e.g. contact adhesive or hot-melt adhesive) into the gap of card body 1, as in FIG. 8. If an attempt is made to remove security label 27 from data carrier 1 after security label 27 has been glued in, electronic protective case 18 firmly glued to data carrier 1 via adhesive 28 comes off insulating layer 20 of integrated circuit 7, due to silicone paths 25. This produces a voltage at terminals 22, as explained in detail above, which causes for example erasure of sensitive data in the memory of integrated circuit 7.

In a development of a data carrier with spatially separated integrated circuits not shown here, second integrated circuit 7 can be an integral part of a self-adhesive label which is glued either to the side of the data carrier opposite the first integrated circuit or to the same side thereof. Such self-adhesive labels with circuits integrated therein have been known to the expert for some time and will not be explained more closely here. The use of such self-adhesive labels has the advantage that no additional gap need be provided in the data carrier for integrated circuit 7. Additionally one can of course also provide an electronic protective case, as in the aforementioned embodiments.

First integrated circuit 4 shown in FIG. 8 can of course be an integral part of a self-adhesive label so that card body 1 need no longer have any gap. In this case the two self-adhesive labels can be glued to the same side of the data carrier or to opposite sides of the data carrier.

Figure 10:
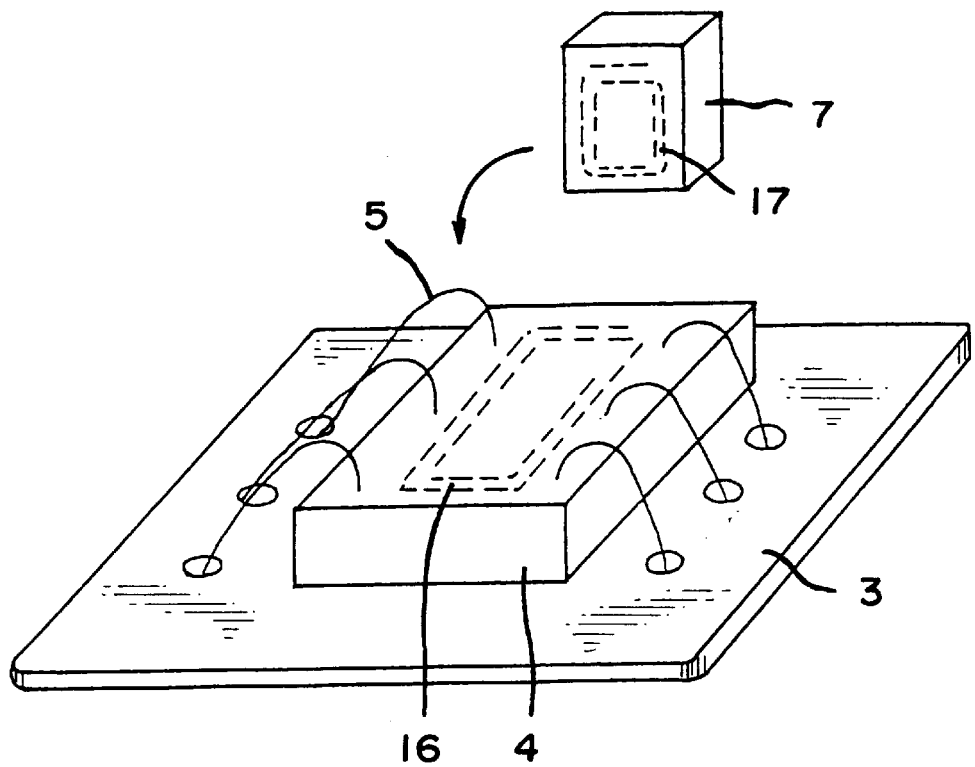

FIG. 10 shows a perspective view of an unfinished electronic module as can be used for producing the electronic modules of FIGS. 1 to 6 and FIG. 8, together with second integrated circuit 7 which can be disposed either directly on integrated circuit 4 or spatially separated in the data carrier. Both integrated circuit 4 and integrated circuit 7 have monolithically integrated coils 16 and 17 as elements for contactless, nongalvanic communication with the other circuit. An electronic module for incorporation in the data carrier of FIG. 2 is finished as follows. In a first step, the edge area of integrated circuit 4 is cast with casting compound 6 with the casting mold shown in FIG. 4. In a second step, integrated circuit 7 is mounted and the remaining cavity filled with casting compound 15. In a last step, contact adhesive 8 is applied. The step of casting the edge area of integrated circuit 4 can of course also be omitted. The two circuits disposed one on the other are then cast jointly by an analogous method as described in the following in connection with the production of an electronic module for the data carrier of FIG. 8.

For producing electronic module 17 according to FIG. 8 one applies a contact adhesive ring in a first step. In a second step, integrated circuit 4 is cast with casting compound 6, the contact adhesive ring acting as a casting frame for the casting compound.

Figure 11:
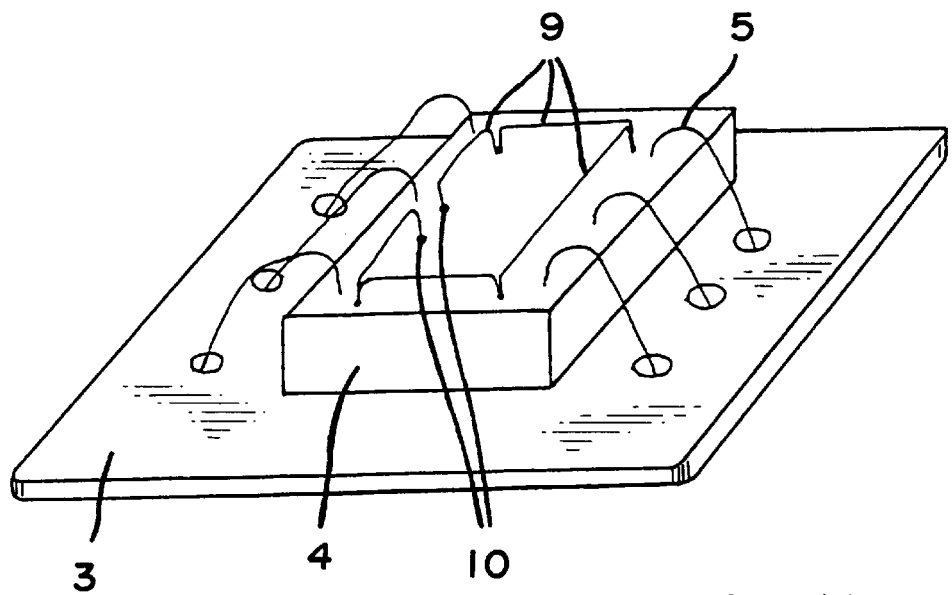
Figure 12:
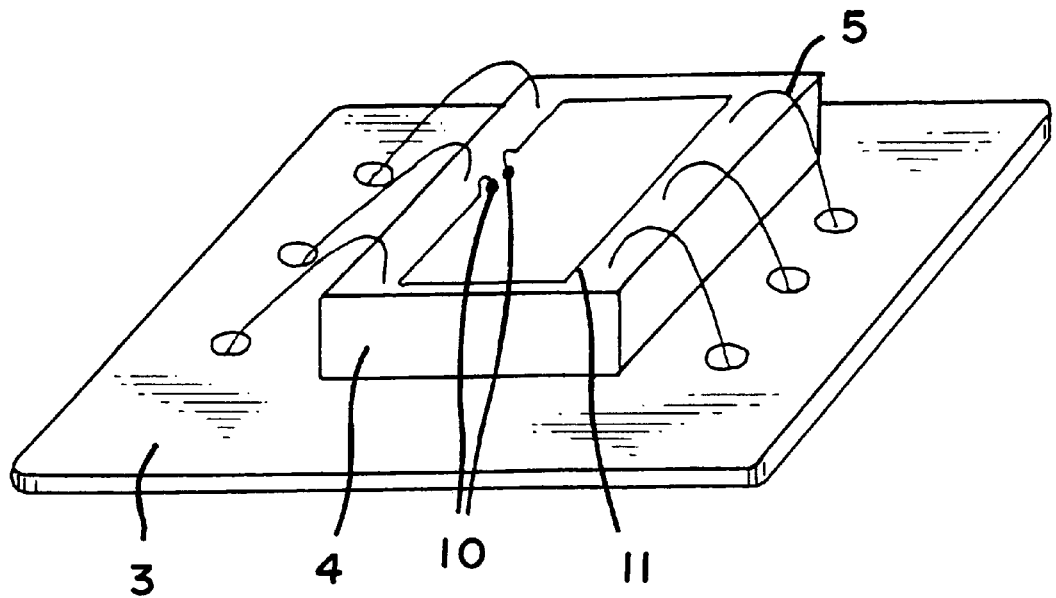
Figure 13:
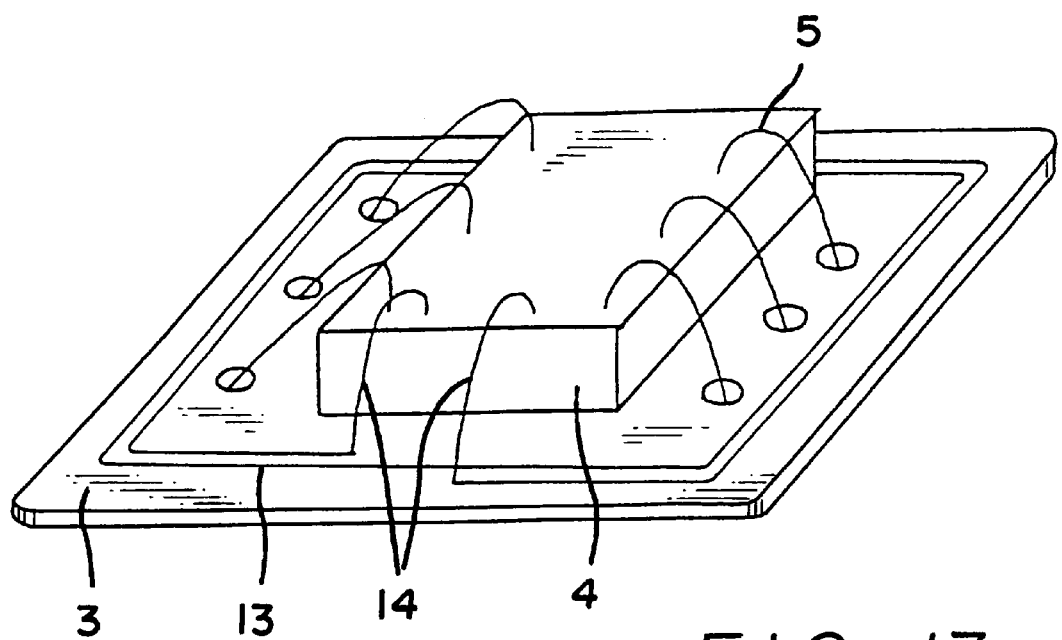

FIGS. 11 to 13 show perspective views of further embodiments of unfinished electronic modules as can be used for producing the data carriers of FIGS. 1 to 6 and FIG. 8. The electronic modules for incorporation in the data carrier of FIG. 2 or 8 are finished in the way described in connection with FIG. 10.

The embodiment of FIG. 11 has coil 9 for nongalvanic contactless communication with second integrated circuit 7. Coil 9 consists of a plurality of bonding wires whose ends are each connected electrically with points of the integrated circuit intended therefor. Coil 9 was produced by bonding wires connecting a plurality of metalized surfaces present on the surface of the integrated circuit, the end of one bonding wire being connected electrically with the next bonding wire by the metalization. Terminals 10 are the terminals connecting integrated circuit 4 with coil 9. To finish the electronic module of FIG. 2 one must make sure circuit 7 is disposed within coil 9.

In contrast to the module of FIG. 11, the embodiment of FIG. 12 shows coil 11 produced from a single bonding wire. The bonding wire is disposed on the surface of the integrated circuit and connected electrically with the terminals of the integrated circuit. To produce coil 11 one applies to the integrated circuit an adhesive cement well known to the expert. The bonding wire is then bonded to one of terminals 10 and set down at the corner points of coil 11, causing the coil to stick to the adhesive cement at the particular points. Finally, the end of the bonding wire is firmly bonded to second terminal 10 of integrated circuit 4. When finishing the electronic module of FIG. 2 one should likewise dispose circuit 7 within coil 11.

The embodiment of FIG. 13 has, for nongalvanic contactless coupling with second integrated circuit 7, coil 13 which is disposed on a coil carrier of the module—supporting substrate 3 here—and connected electrically via bonding wires 14 with the corresponding terminals of integrated circuit 4. Coil 13 was produced in this special embodiment by being etched out of a metallic layer present on the side of integrated circuit 4.

It is obvious to the expert that the electronic modules shown are merely exemplary. The electronic modules can thus also be produced for example by other techniques, e.g. the lead frame technique, possibly making supporting substrate 3 unnecessary. Moreover, the coupling elements for communication with external devices can also be formed differently, for example as capacitive elements, inductive elements or as optocouplers. Further, the connection with integrated circuit 4 and contact surfaces 2 need not be effected via bonding wires 5 and can also be designed differently, e.g. by the TAB technique. The modules not shown with an electronic protective case can of course likewise have one.

I claim:

1. A data carrier having at least two integrated circuits disposed one on the other in the carrier in a partial area, at least one of the circuits being able to communicate with external devices via coupling elements, characterized in that the integrated circuits (4, 7) have means (9, 11, 13, 16, 17) which permit communication between the circuits via a nongalvanic, contactless coupling.

2. The data carrier of claim 1, characterized in that the integrated circuits are disposed one on the other directly adjacent each other.

3. The data carrier of claim 2, characterized in that the integrated circuits ore interconnected via an adhesive layer.

4. The data carrier of claim 2, characterized in that the nongalvanic contactless coupling between the integrated circuits is disposed on the opposing surfaces of the integrated circuits.

5. The data carrier or claim 1, characterized in that the integrated circuits are disposed in the data carrier spatially separated from each other.

6. The data carrier of claim 5, characterized in that a first integrated circuit (4) is disposed in a gap of the data carrier.

7. The data carrier of claim 6, characterized in that the second integrated circuit (7) is disposed on the side of the data carrier opposite the first integrated circuit in a second gap.

8. The data carrier of claim 7, characterized in that the gap is covered by a self-adhesive label (12).

9. The data carrier of claim 6, characterized in that the second integrated circuit is an integral part of a self-adhesive label which is glued to the side opposite the first integrated circuit or to the side of the first integrated circuit.

10. The data carrier of claim 5, characterized in that the integrated circuits are each an integral part of a self-adhesive label, the labels being glued either to the same side of the data carrier or to opposite sides of the data carrier.

11. The data carrier of claim 1, characterized in that the coupling between the first integrated circuit and the second integrated circuit is designed such that external devices can access the second integrated circuit only via the first integrated circuit.

12. The data carrier of claim 1, characterized in that the coupling between the integrated circuits is effected by coils or capacitive elements or optocouplers.

13. The data carrier of claim 1, characterized in that means (18) are provided which cause at least one of the integrated circuits to be rendered useless upon unlawful removal of at least one integrated circuit from the data carrier or from the electronic module.

14. An electronic module for incorporation in the data carrier of claim 1, comprising an integrated circuit and coupling elements connected electrically with the integrated circuit for communication with external devices, characterized in that the integrated circuit (4) further has means (9, 11, 13, 16, 17) which permit communication with a second integrated circuit via a nongalvanic, contactless coupling.

15. The electronic module of claim 14, characterized in that the means are a coil.

16. The electronic module of claim 15, characterized in that the coil (11) is provided in the form of a bonding wire which is disposed on a surface of the integrated circuit and whose ends are connected electrically with terminals (10) of the integrated circuit.

17. The electronic module of claim 15, characterized in that the coil (9) consists of a plurality or bonding wires whose ends are each connected electrically with points of the integrated circuit intended therefor.

18. The electronic module of claim 15, characterized in that the coil is disposed on a coil carrier (3) of the module, the ends of the coil being connected electrically with terminals of the integrated circuit.

19. The electronic module of claim 14, characterized in that the means are optocouplers or capacitive elements.

20. The electronic module of claim 14, 15 or 19, characterized in that the means are monolithically integrated in the circuit.

21. The electronic module of claim 14, characterized in that partial areas of the integrated circuit are cast by a casting compound while a central inner part on the surface of the integrated circuit is free from casting compound.

22. The electronic module of claim 14, characterized in that a second integrated circuit is disposed directly adjacent on the first integrated circuit and has means permitting communication with the first integrated circuit via a nongalvanic, contactless coupling.

23. A mold for producing the electronic module of claim 21 consisting of two mold halves (17, 20), one mold half being completely flat and the second mold half having a cavity for receiving the casting material, characterized in that a movable die (19) is additionally provided in the center of the mold cavity to prevent a central inner part of the mold cavity from being filled with casting compound during casting.

* * * * *